(12) United States Patent
Lin et al.

(10) Patent No.: US 9,455,402 B2
(45) Date of Patent: Sep. 27, 2016

(54) RESISTIVE MEMORY DEVICE WITH RING-SHAPED METAL OXIDE ON TOP SURFACES OF RING-SHAPED METAL LAYER AND BARRIER LAYER

(71) Applicant: MACRONIX INTERNATIONAL CO., LTD., Hsinchu (TW)

(72) Inventors: Yu-Yu Lin, New Taipei (TW);
Feng-Min Lee, Hsinchu (TW);
Kuang-Hao Chiang, Taoyuan (TW);
Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/603,390

(22) Filed: Jan. 23, 2015

(65) Prior Publication Data
US 2016/0225983 A1  Aug. 4, 2016

(51) Int. Cl.
*H01L 45/00* (2006.01)
(52) U.S. Cl.
CPC ......... *H01L 45/1233* (2013.01); *H01L 45/146* (2013.01); *H01L 45/16* (2013.01)
(58) Field of Classification Search
CPC .................. H01L 45/1233; H01L 45/146
See application file for complete search history.

(56) References Cited

U.S. PATENT DOCUMENTS

| 2007/0281420 | A1* | 12/2007 | Lai ........................ H01L 45/04 438/253 |
| 2010/0219392 | A1* | 9/2010 | Awaya ................ H01L 27/2454 257/3 |
| 2010/0246152 | A1* | 9/2010 | Lin ........................... G06F 1/16 361/783 |
| 2010/0301480 | A1* | 12/2010 | Choi ..................... H01L 27/228 257/751 |
| 2011/0220863 | A1* | 9/2011 | Mikawa ................ H01L 27/101 257/4 |
| 2012/0063201 | A1* | 3/2012 | Hayakawa ......... G11C 13/0007 365/148 |
| 2012/0268980 | A1* | 10/2012 | Awaya ............... G11C 13/0007 365/148 |
| 2013/0010529 | A1* | 1/2013 | Hayakawa ............ H01L 27/101 365/148 |

FOREIGN PATENT DOCUMENTS

TW        201133757 A    10/2011

OTHER PUBLICATIONS

TIPO Office Action dated Apr. 28, 2016 in Taiwan application (No. 104102459).

* cited by examiner

*Primary Examiner* — Thanh V Pham
(74) *Attorney, Agent, or Firm* — McClure, Qualey & Rodack, LLP (57) ABSTRACT

A resistive memory device is provided, comprising a bottom electrode, a patterned dielectric layer with a via formed on the bottom electrode, a barrier layer formed at sidewalls and a bottom surface of the via as a liner, a ring-shaped metal layer formed at sidewalls and a bottom surface of the barrier layer, and a ring-shaped metal oxide formed on a top surface of the ring-shaped metal layer.

7 Claims, 7 Drawing Sheets

RESISTIVE MEMORY DEVICE WITH RING-SHAPED METAL OXIDE ON TOP SURFACES OF RING-SHAPED METAL LAYER AND BARRIER LAYER

BACKGROUND

1. Field of the Invention

The disclosure relates in general to a resistive memory device and a method for manufacturing the same, more particularly to a resistive memory device with improved electrical characteristics and a method for manufacturing the same.

2. Description of the Related Art

A memory device such as a nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed.

Figure 1:
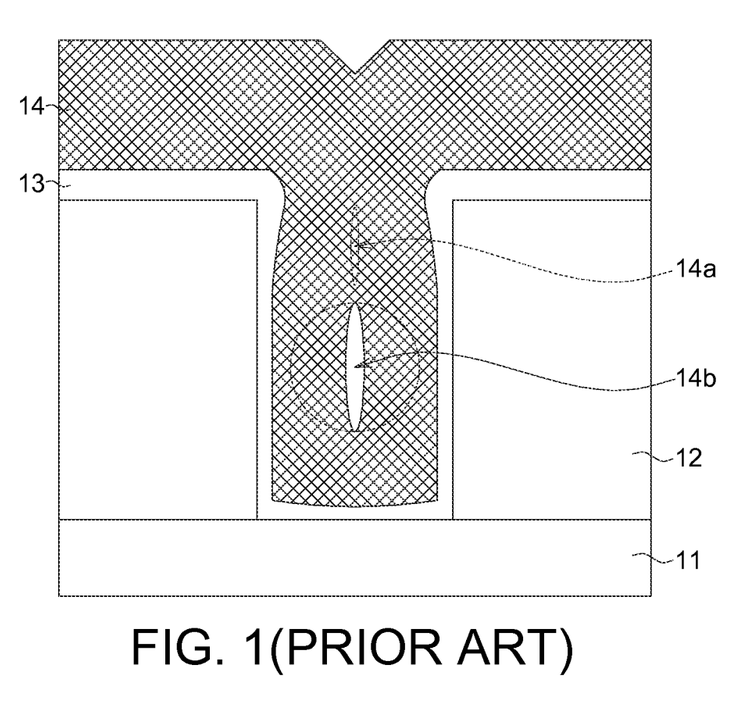
FIG. 1 (PRIOR ART) illustrates parts of a conventional resistive memory device with defects.

Resistive random-access memory (RRAM or ReRAM) is a non-volatile memory type. Resistive memories attract much attention due to its simple MIM (Metal-Insulator-Metal) structure and promising scalability. Different forms of ReRAM have been disclosed, based on different dielectric materials, spanning from perovskites to transition metal oxides to chalcogenides. However, the conventional resistive memory devices suffer from the defects of seams and voids in the metal layer during the fill-in procedure of the manufacture. FIG. 1 illustrates parts of a conventional resistive memory device with defects. As shown in FIG. 1, a patterned dielectric layer 12 with a via is formed on a bottom electrode 11, a barrier layer 13 is formed along the sidewalls and a bottom surface of the via within the patterned dielectric layer 12, and a metal layer 14 fills the via, followed by polishing and oxidation for growing the metal oxide as a memory layer of the resistive memory device. In the conventional metal fill-in procedure, the defects of seams 14a and/or voids 14b would be easily occurred in the metal layer 14, particularly in the center of the metal layer 14. The defects of seams 14a and/or voids 14b causes the weaker region in the metal layer 14 (i.e. the seam region, which would be easily oxidized than other regions in the metal layer 14), and the resistance variation after the oxidation process, thereby decreasing the reliability of electrical characteristics of the resistive memory device.

Thus, it would be desirable to develop and realize a resistive memory device with reliable structure and excellent electrical properties.

SUMMARY

The disclosure relates to a resistive memory device and a method for manufacturing the same. The resistive memory device of the embodiment provides a simple and reliable configuration to shrink the contact size (such as ring-shaped metal and metal oxide) and the electrical characteristics of the resistive memory device have been significantly improved.

According to the embodiment, a resistive memory device is provided, comprising a bottom electrode, a patterned dielectric layer with a via formed on the bottom electrode, a barrier layer formed at sidewalls and a bottom surface of the via as a liner, a ring-shaped metal layer formed at sidewalls and a bottom surface of the barrier layer, and a ring-shaped metal oxide formed on a top surface of the ring-shaped metal layer.

According to the embodiment, a method for manufacturing a resistive memory device is disclosed, comprising: providing a bottom electrode; forming a patterned dielectric layer with a via on the bottom electrode; forming a barrier layer at sidewalls and a bottom surface of the via as a liner; forming a ring-shaped metal layer at sidewalls and a bottom surface of the barrier layer; and forming a ring-shaped metal oxide on a top surface of the ring-shaped metal layer.

The disclosure will become apparent from the following detailed description of the preferred but non-limiting embodiments. The following description is made with reference to the accompanying drawings.

DETAILED DESCRIPTION

The embodiments of the present disclosure disclosed below are for elaborating a resistive memory device and a method for manufacturing the same. The resistive memory device of the embodiment can be widely applied in the resistive memory (such as ReRAM) array. According to the embodiment, the resistive memory device provides a simple and reliable configuration to shrink the contact size (i.e. ring-shaped metal oxide) and the electrical characteristics of the resistive memory device have been improved. Also, the resistive memory device of the embodiment shows high initial resistance, which indicates good and uniform oxidation.

It is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments.

Figure 2A:
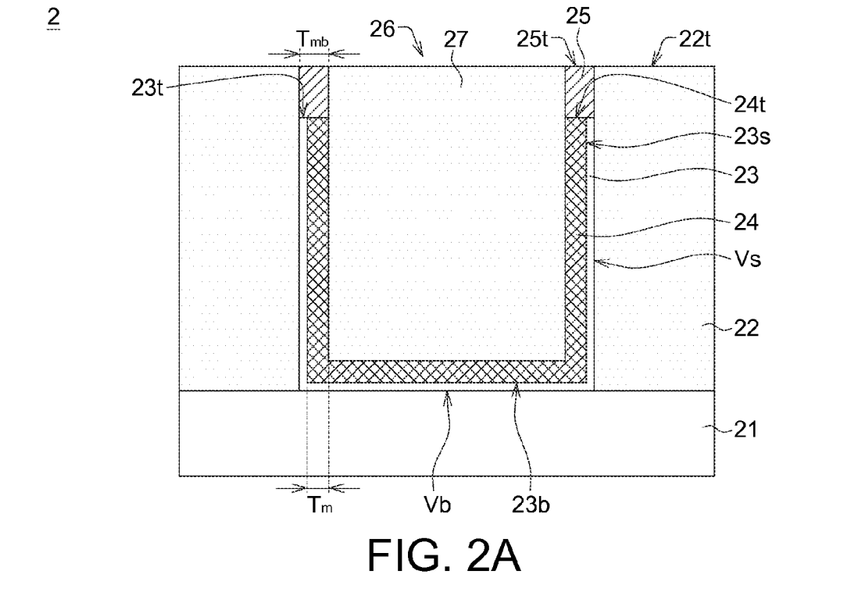
FIG. 2A is a cross-sectional view of a resistive memory device according to one of the embodiments of the disclosure.
Figure 2B:
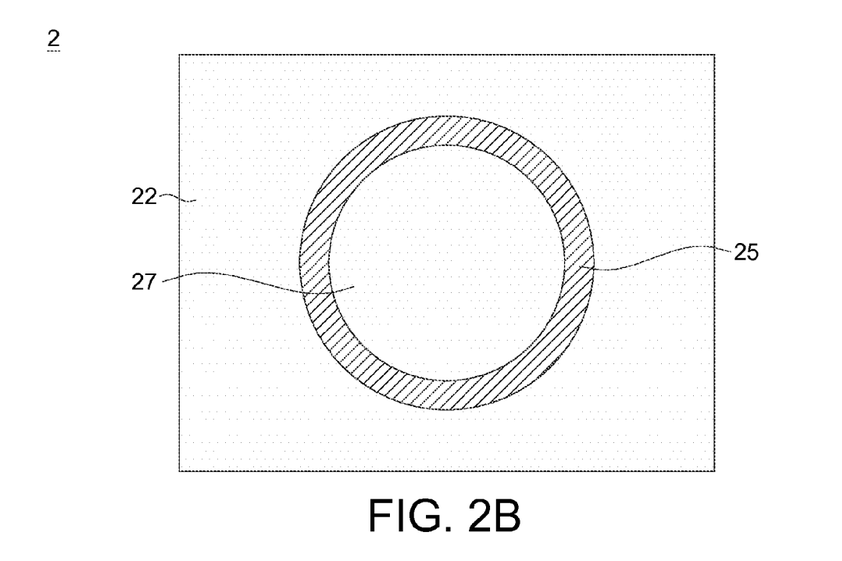
FIG. 2B is a top view of a resistive memory device according to one of the embodiments of the disclosure.

FIG. 2A is a cross-sectional view of a resistive memory device according to one of the embodiments of the disclosure. FIG. 2B is a top view of a resistive memory device according to one of the embodiments of the disclosure. As shown in FIGS. 2A and 2B, a resistive memory device 2 comprises a bottom electrode 21, a patterned dielectric layer 22 with a via formed on the bottom electrode 21, a barrier layer 23 formed at the sidewalls Vs and a bottom surface Vb of the via, a ring-shaped metal layer 24 formed at the sidewalls 23s and the bottom surface 23b of the barrier layer 23, and a ring-shaped metal oxide 25 formed on a top surface 24t of the ring-shaped metal layer 24.

According to the embodiment, the ring-shaped metal oxide 25 on the top surface 24t of the ring-shaped metal layer 24 defines a hole 26, and a medium layer 27 such as an insulation or a conductive layer can be filled in the hole 26 (manufacturing methods are described later). In one embodiment, a top electrode (not shown) would be formed on the ring-shaped metal oxide 25, wherein the top electrode and the ring-shaped metal oxide 25 produce a self-rectified property.

In one embodiment, the top surface 23t of the barrier layer 23 is lower than the top surface 22t of the patterned dielectric layer 22. In one embodiment, the top surface 24t of the ring-shaped metal layer 24 is lower than the top surface 22t of the patterned dielectric layer 22. In one embodiment, the top surface 24t of the ring-shaped metal layer 24 is substantially aligned with the top surface 22t of the patterned dielectric layer 22 (as shown in FIG. 2A), or slightly higher than the top surface 22t of the patterned dielectric layer 22.

It is noted that the detailed structure of the resistive memory device would be varied or modified according to the manufacturing procedures of the practical applications. The structural configuration of FIG. 2A only demonstrate one of the embodiments, and some of the elements may exist but not shown in FG. 2A; for example, the resistive memory device may further comprise a barrier oxide (such as TiOx) (not shown in FIG. 2A) formed on the top surface 23t of the barrier layer 23 after oxidation.

The bottom electrode 21 of the embodiment is made from a conductive material, such as metal or semiconductor material. Metals for making the bottom electrode 21 could be Yb, Tb, Y, La, Sc, Hf, Zr, Al, Ta, Ti, Nb, Cr, V, Zn, W, Mo, Cu, Re, Ru, Co, Ni, Rh, Pd, Pt, but the disclosure is not limited thereto. In one embodiment, the bottom electrode 21 could be a layer of tungsten silicide (WSix) deposited on a semiconductor layer such as N+ poly or P+ poly for preventing peeling of WSix. According to one embodiment, the patterned dielectric layer 22 comprises oxide (ex: $SiO_2$) or nitride (ex: SiN). According to the embodiment, examples of the ring-shaped metal layer 24 include, but not limited to, W, WSi, Ti, TiN, Hf, Al, CoSi, NiSi, Cu, Zr, Nb, Ta, and other suitable materials. According to one embodiment, examples of the ring-shaped metal oxide 25 include, but not limited to, WOx, WSiOx (or WxSiyOz, WSixOy), CoxSiyOz, NixSi-yOz, TiOx, NiOx, AlOx, CuOx, ZrOx, NbOx, TaOx, TiNO, and other suitable materials. Materials of the elements of the embodiments can be modified or changed according to the actual needs of the practical application, and the materials described herein are for illustration of the disclosure only.

Additionally, the ring-shaped metal layer 24 can be formed by chemical vapor deposition (CVD), physical vapor deposition (PVD), atomic layer deposition (ALD), sputtering process or any suitable procedure. In one embodiment, the thickness Tm of the ring-shaped metal layer 24 is in a range of about tens of angstroms to couple hundreds of angstroms. Also, the ring-shaped metal oxide 25 can be formed by rapid thermal oxidation (RTO), wet chemical oxidation, plasma electrolytic oxidation (PEO) or any suitable procedure. In one embodiment, the thickness Tmb of the ring-shaped metal oxide 25 is in a range of about 100 angstroms to 400 angstroms.

Figure 3A:
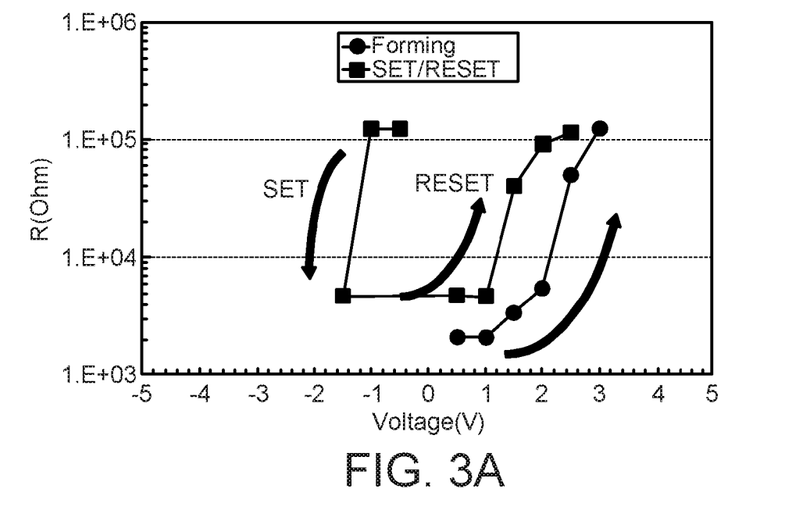
FIG. 3A shows operations of a conventional resistive memory device, including Forming, SET and RESET processes.
Figure 3B:
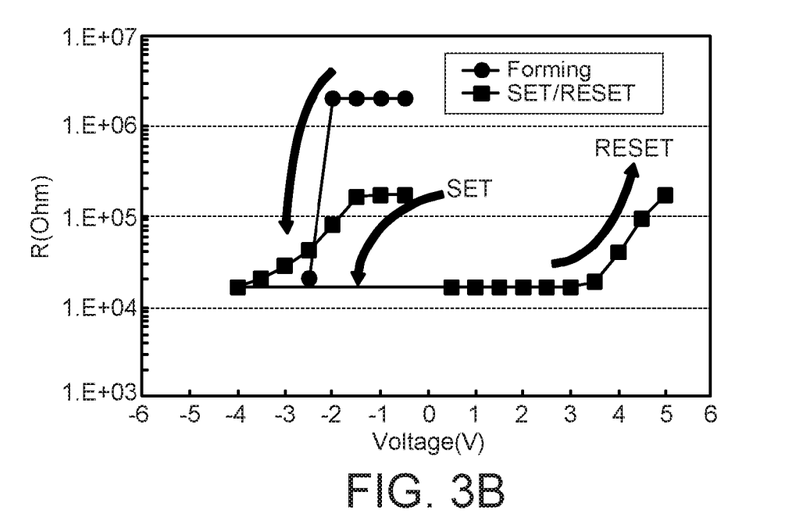
FIG. 3B shows operations of a resistive memory device of an embodiment, including Forming, SET and RESET processes.

According to the disclosure, the resistive memory device of the embodiment possesses reliable structure and improved electrical characteristic. Take the resistive random-access memory (ReRAM) having WOx as metal oxide (i.e. the memory layer) for example. FIG. 3A shows operations of a conventional resistive memory device, including Forming, SET and RESET processes. FIG. 3B shows operations of a resistive memory device of an embodiment, including Forming, SET and RESET processes. Please refer to FIG. 3A and FIG. 3B. In FIG. 3A and FIG. 3B, the resistive random-access memory (ReRAM) devices having WOx as metal oxides (i.e. the memory layer) are tested for performance comparison. According to the conventional resistive memory device (i.e. the metal layer 14 fully filled in the via between the barrier layer 13 as shown in FIG. 1 and a metal oxide grown to fully cover the top of the metal layer 14), an initial resistance in the forming processes is very low (for example, about 1K ohm to 10K ohm), and an initial higher operation current (for example, about 3 mA to 6 mA) is required to bring a low resistance to a high resistance for operation.

As shown in FIG. 3B, the resistive memory device of the embodiment (i.e. a ring-shaped WOx ReRAM) can be reset by applying a positive pulse to reach the RESET state, wherein a low resistance is increased to a high resistance during the operation. Also, the resistive memory device of the embodiment can be set by applying a negative pulse to reach the SET state, wherein a high resistance is decreased to a low resistance during the operation. Also, the resistive memory device of the embodiment shows a high initial resistance (for example, about 1 M (mega) ohm to 1 G (giga) ohm), which indicates good and uniform oxidation of the resistive memory device. Moreover, it is only required an initial lower operation current (for example, about 0.4 mA to 0.6 mA) for the operation of the ring-shaped WOx ReRAM of the embodiment.

Accordingly, compared to the conventional resistive memory device (ex. the WOx ReRAM of FIG. 3A), the resistive memory device of the embodiment still performs the SET and RESET processes successfully, but shows a higher initial resistance in the forming processes and a lower operation current required for the operation. Also, no defects of seams and/or voids occur in the metal layer of the embodied resistive memory device, and the resistance variation as shown in the conventional resistive memory device can be avoided. Thus, the electrical characteristics and operation reliability of the resistive memory device of the embodiment can be significantly improved. One set of the experimental date for the conventional resistive memory device and the embodied resistive memory device are summarized in Table 1.

TABLE 1

| ReRAM Type | Conventional ReRAM | Ring-shaped WOx ReRAM |
|---|---|---|
| Initial Resistance | 1K ohm-10K ohm | 1M ohm-1G ohm (Controllable) |
| Operation Voltage | <5V | About 5V |
| Operation Current | 3 mA-6 mA | 0.4 mA-0.6 mA |
| Cycling | >1K | >1K |

Moreover, the resistive memory device of the embodiment shows a controllable initial resistance by varying the temperature of the oxidation. Assumed that the oxidation of the ring-shaped metal layer 24 is conducted by RTO (rapid thermal oxidation). It is observed that the resistive memory device with ring-shaped metal layer and metal oxide (ex: ring-shaped WOx ReRAM) of the embodiment shows more sensitive window and controllable initial resistance based on the temperature of RTO.

Figure 4:
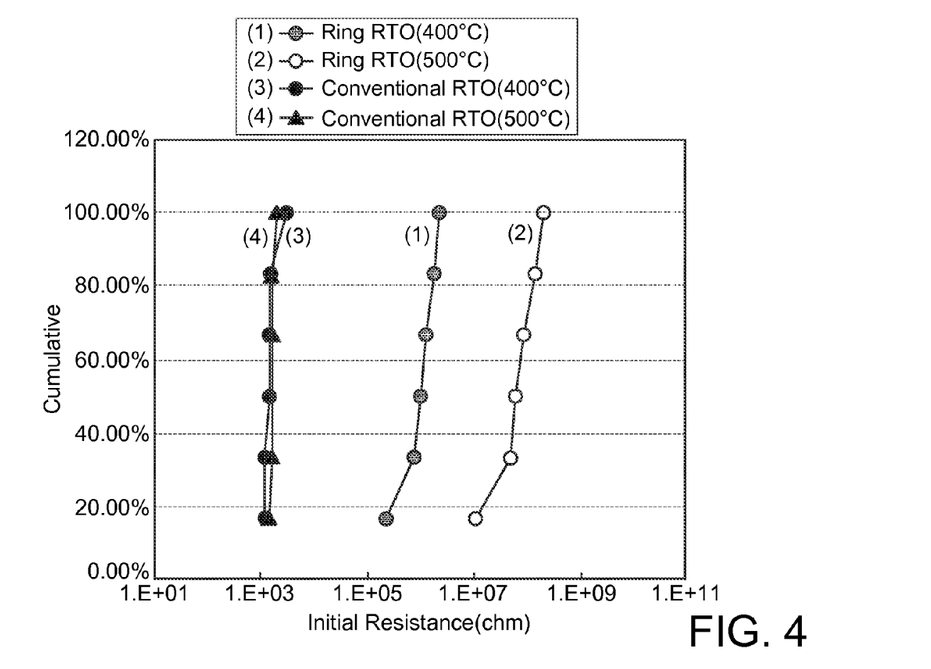
FIG. 4 shows the initial resistances of the conventional and embodied resistive memory devices manufactured by rapid thermal oxidation (RTO) according to ECL experimental data.

FIG. 4 shows the initial resistances of the conventional and embodied resistive memory devices manufactured by rapid thermal oxidation (RTO) according to ECL experimental data. In FIG. 4, curves (1) and (2) represent the embodied resistive memory devices having the ring-shaped metal oxides 25 respectively formed by RTO at 400° C. and 500° C., and a clear difference between the initial resistances of curves (1) and (2) is observed. In FIG. 4, curves (3) and (4) represent the conventional resistive memory devices having metal oxides formed by RTO at 400° C. and 500° C., which show almost the same initial resistance.

Figure 5:
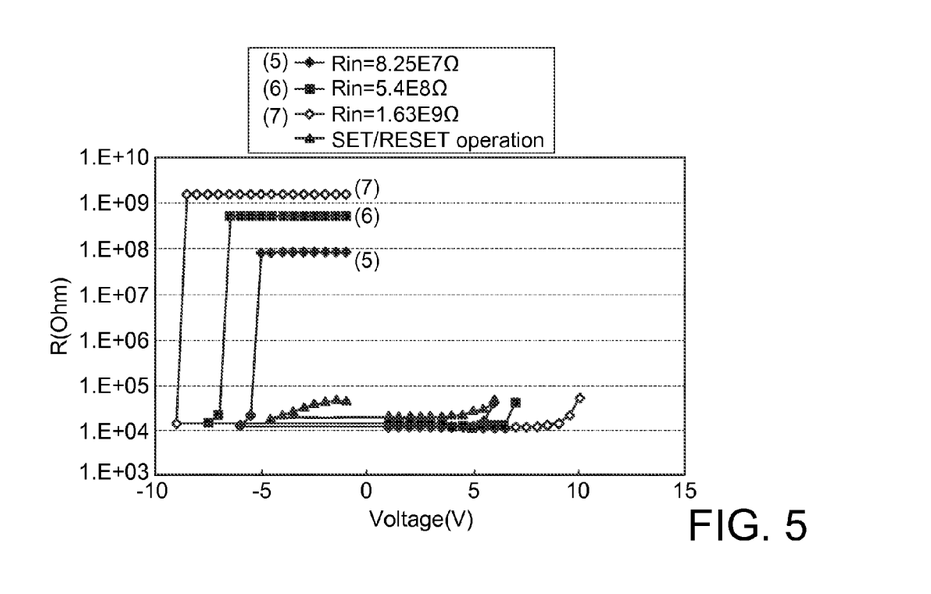
FIG. 5 shows the relationships of the forming voltages and the initial resistances of the embodied resistive memory devices in the forming process, wherein the ring-shaped metal oxides are formed by rapid thermal oxidation at different temperatures.

FIG. 5 shows the relationships of the forming voltages and the initial resistances of the embodied resistive memory devices in the forming process, wherein the ring-shaped metal oxides are formed by rapid thermal oxidation (RTO) at different temperatures. In FIG. 5, curves (5) represents the embodied resistive memory device having the ring-shaped metal oxide 25 formed by RTO at 400° C., and the initial resistance (Rin) corresponding to the forming voltage is about $8.25 \times 10^7 \Omega$. Curve (6) represents the embodied resistive memory device having the ring-shaped metal oxide 25 formed by RTO at 450° C., and the initial resistance (Rin) corresponding to the forming voltage is about $5.4 \times 10^8 \Omega$. Curve (7) represents the embodied resistive memory device having the ring-shaped metal oxide 25 formed by RTO at 500° C., and the initial resistance (Rin) corresponding to the forming voltage is about $1.63 \times 10^9 \Omega$. According to the experimental result, an initial resistance of the resistive memory device of the embodiment varies with the temperature of the process for forming the ring-shaped metal oxide 25. As shown in FIG. 5, the forming voltage is increased with the initial resistance (Rin). The higher the initial resistance (Rin), the higher the forming voltage. Noted that RTO temperatures provided herein are for illustration only, not for limitation. Other suitable temperature can be chosen as the oxidation temperature. In one embodiment, the ring-shaped metal oxide 25 can be formed by a process conducted at a temperature ranged from 400° C.~600° C.

Figure 6:
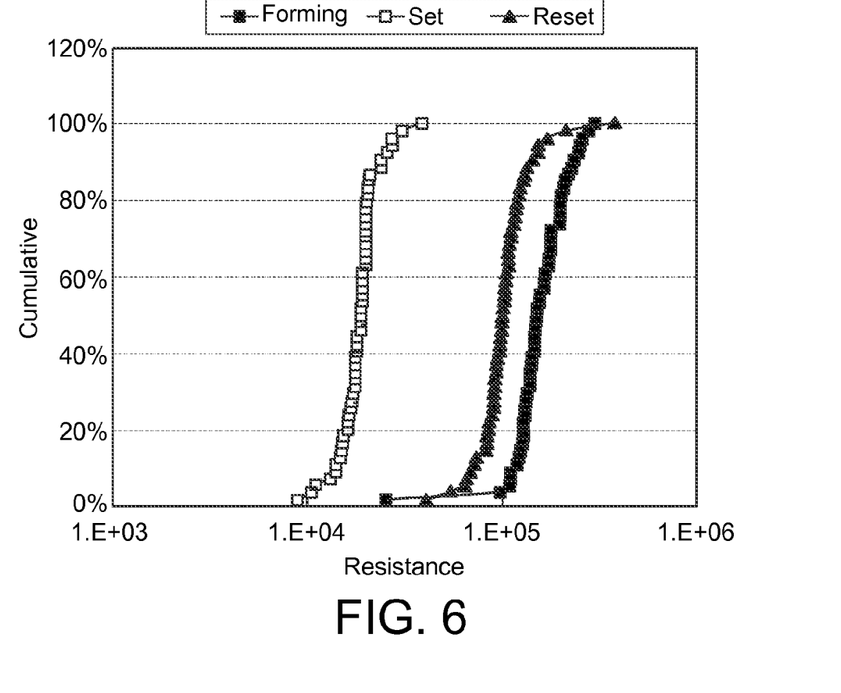
FIG. 6 shows operation simulations of Forming, SET and RESET processes of the resistive memory device of the embodiment.

When the resistive memory device of the embodiment is applied to a practical array configuration, the electrical properties have been improved. FIG. 6 shows operation simulations of Forming, SET and RESET processes of the resistive memory device of the embodiment, wherein the operation condition is 5V/500 μA (ECL experimental data). As shown in FIG. 6, the Forming state, SET state and RESET state can be clearly differentiated. When the embodied resistive memory device with ring-shaped metal oxide is applied to 1T1R (one transistor, one resistor) array, more desirable electrical properties would be obtained due to the improved configuration of the embodied resistive memory device.

Two of the applicable methods for manufacturing the resistive memory device with ring-shaped memory layer according to the embodiment are exemplified below for illustration, but not for limitation, of the practical procedures.

Figure 7A:
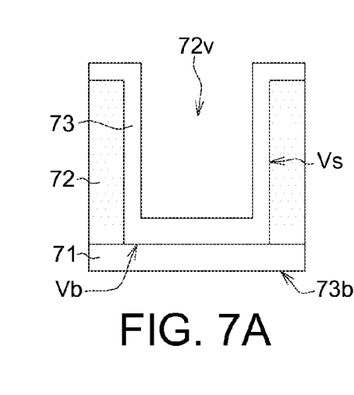
FIG. 7A to FIG. 7F illustrate a first method for manufacturing a resistive memory device according to an embodiment of the present disclosure.
Figure 7B:
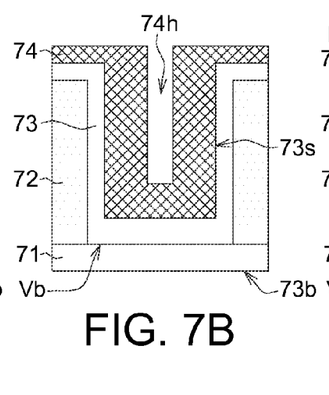
Figure 7C:
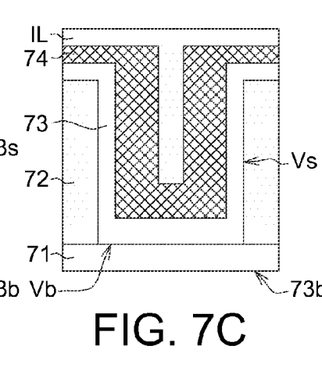
Figure 7D:
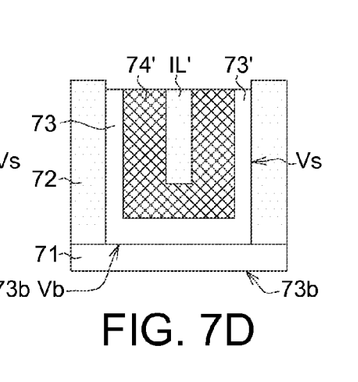
Figure 7E:
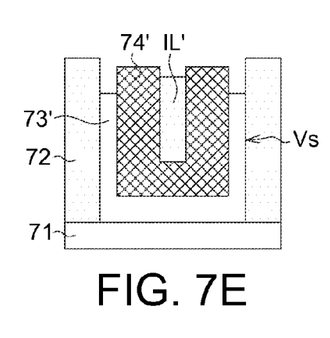
Figure 7F:
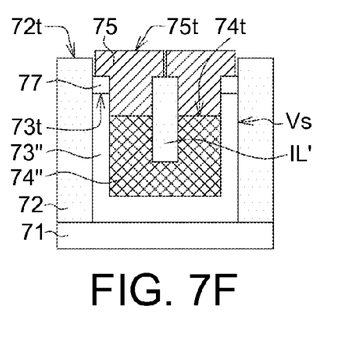

FIG. 7A to FIG. 7F illustrate a first method for manufacturing a resistive memory device according to an embodiment of the present disclosure. As shown in FIG. 7A, a patterned dielectric layer (such as SiN) 72 with a via 72v is formed on a bottom electrode 71, and a barrier layer (such as TiN) 73 is deposited on the patterned dielectric layer 72 and formed at the sidewalls Vs and the bottom surface Vb of the via 72v as a liner. As shown in FIG. 7B, a ring-shaped metal layer 74 (such as tungsten, W) is deposited at the sidewalls 73s and the bottom surface 73b of the barrier layer 73 (by CVD, PVD, ALD, sputtering or other suitable process), wherein the ring-shaped metal layer 74 defines a hole 74h. As shown in FIG. 7C, an insulating layer (i.e. a dielectric layer, such as oxide) IL is deposited on the ring-shaped metal layer 74 and fills up the hole 74h. As shown in FIG. 7D, the insulating layer IL, the ring-shaped metal layer 74 and the barrier layer 73 are then planarized such as by chemical-mechanical planarization (CMP), so as to form the insulation IL'. As shown in FIG. 7E, the barrier layer 73' is etched back (and the insulating layer IL' could be etched back optionally). As shown in FIG. 7F, an oxidation process (such as RTO, wet chemical oxidation, PEO or other suitable process) is conducted, for growing the ring-shaped metal oxide 75 on the top surface 74t of the ring-shaped metal layer 74" by oxidizing the ring-shaped metal layer 74'.

According to the embodiment illustrated in FIG. 7A to FIG. 7F, a barrier oxide (such as TiOx) 77 is also grown on the top surface 73t of the barrier layer 73" by the oxidation process (FIG. 7F), wherein the barrier oxide 77 and the ring-shaped metal oxide 75 are formed (/grown) simultaneously. In one embodiment, the top surface of the insulation IL' is higher than the top surface 74t of the ring-shaped metal layer 74" after the oxidation process. Also, in one embodiment, the top surface 72t of the patterned dielectric layer 72 is higher than the top surface 73t of the barrier layer 73", and higher than the top surface 74t of the ring-shaped metal layer 74".

Figure 8A:
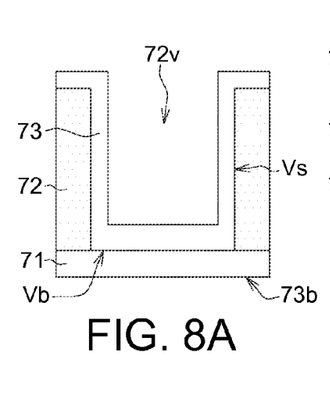
FIG. 8A to FIG. 8F illustrate a second method for manufacturing a resistive memory device according to another embodiment of the present disclosure.
Figures 8B, 8C:
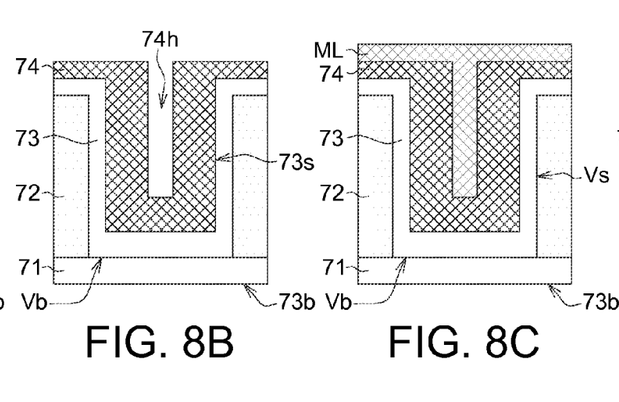

FIG. 8A to FIG. 8F illustrate a second method for manufacturing a resistive memory device according to another embodiment of the present disclosure. The identical and/or similar elements in FIG. 8A to FIG. 8F and FIG. 7A to FIG. 7F are designated with the same and/or similar reference numerals. As shown in FIG. 8A (same as FIG. 7A), a patterned dielectric layer (such as SiN) 72 with a via 72v is formed on a bottom electrode 71, and a barrier layer (such as TiN) 73 is deposited on the patterned dielectric layer 72 and formed at the sidewalls Vs and the bottom surface Vb of the via 72V as a liner. As shown in FIG. 8B (same as FIG. 7B), a ring-shaped metal layer 74 (such as tungsten, W) is deposited at the sidewalls 73s and the bottom surface 73b of the barrier layer 73 (by CVD, PVD, ALD, sputtering or other suitable process), wherein the ring-shaped metal layer 74 defines a hole 74h.

Figure 8D:
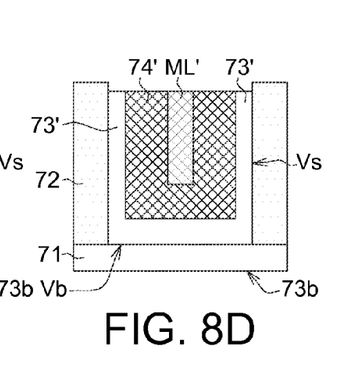
Figures 8E, 8F:
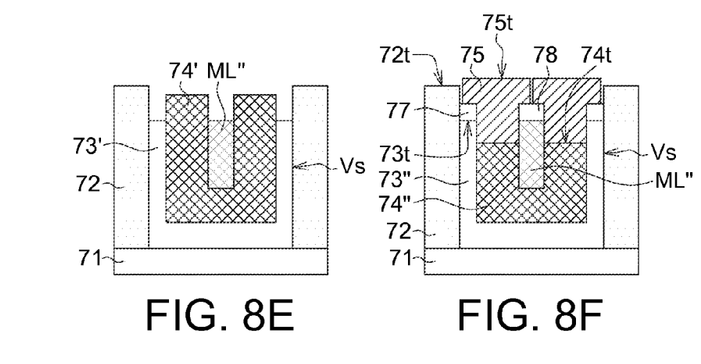

As shown in FIG. 8C, a conductor (ex: metal layer) ML is deposited on the ring-shaped metal layer 74 and fills up the hole 74h. As shown in FIG. 8D, the conductor ML, the ring-shaped metal layer 74 and the barrier layer 73 are then planarized such as by chemical-mechanical planarization (CMP), so as to form a conductive layer ML' filling in the hole 74h. As shown in FIG. 8E, the barrier layer 73' and the conductive layer ML' are etched back. As shown in FIG. 8F, an oxidation process (such as RTO, wet chemical oxidation, PEO or other suitable process) is conducted, for growing the ring-shaped metal oxide 75 on the top surface 74t of the ring-shaped metal layer 74" by oxidizing the ring-shaped metal layer 74', and growing a conductive oxide 78 on the top surface of the conductive layer ML" simultaneously. According to the embodiment illustrated in FIG. 8A to FIG. 8F, a barrier oxide (such as TiOx) 77 is also grown on the top surface 73t of the barrier layer 73" by the oxidation process (FIG. 8F), wherein the barrier oxide 77, the ring-shaped metal oxide 75 and the conductive oxide 78 are formed (/grown) simultaneously. In one embodiment, the top surface of the conductive layer ML" is higher than the top surface 74t of the ring-shaped metal layer 74" after the oxidation process. Also, in one embodiment, the top surface 72t of the patterned dielectric layer 72 is higher than the top surface 73t of the barrier layer 73", and higher than the top surface 74t of the ring-shaped metal layer 74, and also higher than the top surface of the conductive layer ML".

According to the aforementioned descriptions, the resistive memory device of the embodiment provides a simple and reliable configuration to shrink the contact size (i.e. ring-shaped metal oxide) and the electrical characteristics of the resistive memory device have been improved. For example, no defects of seams and/or voids occur in the metal layer of the embodied resistive memory device, and a higher (and controllable) initial resistance can be obtained. Furthermore, the initial resistance of the embodied resistive memory device can be adjusted and controlled by varying the temperature of oxidation. Also, the forming voltage of the embodied resistive memory device is increased with the initial resistance (Rin) (the higher the initial resistance, the higher the forming voltage). Moreover, the method of manufacturing the resistive memory device of the embodiment provides a simplified process methodology, which adopts no time-consuming and expensive manufacturing procedures, and is suitable for mass production.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistive memory device, at least comprising:
    a bottom electrode;
    a patterned dielectric layer with a via formed on the bottom electrode;
    a barrier layer formed at sidewalls and a bottom surface of the via as a liner;
    a ring-shaped metal layer formed at sidewalls and a bottom surface of the barrier layer;
    a ring-shaped metal oxide formed on a top surface of the ring-shaped metal layer and a top surface of the barrier layer; and
    wherein the top surface of the ring-shaped metal layer and the top surface of the barrier layer is lower than a top surface of the patterned dielectric layer.

2. The resistive memory device according to claim 1, further comprising a barrier oxide formed on a top surface of the barrier layer.

3. The resistive memory device according to claim 1, wherein the ring-shaped metal layer defines a hole, and a medium layer is filled in the hole.

4. The resistive memory device according to claim 3, wherein the medium layer is an insulation, and a top surface of the insulation is higher than the top surface of the ring-shaped metal layer.

5. The resistive memory device according to claim 3, wherein the medium layer is a conductive layer, and the resistive memory device further comprises:
    a conductive oxide formed on a top surface of the conductive layer.

6. The resistive memory device according to claim 1, wherein the conductive layer and the barrier layer comprise the same material.

7. The resistive memory device according to claim 1, having an initial resistance in a range of 1 mega ohm to 1 giga ohm.

* * * * *